US012606903B2

(12) United States Patent
Kimoto et al.

(10) Patent No.: US 12,606,903 B2
(45) Date of Patent: Apr. 21, 2026

(54) VACUUM EVAPORATION METHOD

(71) Applicant: ULVAC, INC., Kanagawa (JP)

(72) Inventors: Takahito Kimoto, Kanagawa (JP);
Masashi Yasuda, Kanagawa (JP);
Toshiharu Kurauchi, Kanagawa (JP);
Shunsuke Sasaki, Kanagawa (JP);
Yuusuke Ujihara, Kanagawa (JP)

(73) Assignee: ULVAC, INC., Kanagawa (JP)

( * ) Notice: Subject to any disclaimer, the term of this
patent is extended or adjusted under 35
U.S.C. 154(b) by 59 days.

(21) Appl. No.: 18/429,838

(22) Filed: Feb. 1, 2024

(65) Prior Publication Data

US 2024/0301545 A1     Sep. 12, 2024

(30) Foreign Application Priority Data

Mar. 7, 2023     (JP) ................................. 2023-034322
Nov. 20, 2023     (JP) ................................. 2023-196486

(51) Int. Cl.
*C23C 14/26*          (2006.01)
(52) U.S. Cl.
CPC .................................... *C23C 14/26* (2013.01)
(58) Field of Classification Search
CPC ...... C23C 14/26; C23C 14/243; C23C 14/548
See application file for complete search history.

(56) References Cited

FOREIGN PATENT DOCUMENTS

| CN | 217459567 U | * | 9/2022 |
| JP | 2007-46106 A | | 2/2007 |
| JP | 2007154216 A | * | 6/2007 |

* cited by examiner

*Primary Examiner* — Dah-Wei D. Yuan
*Assistant Examiner* — Nga Leung V Law
(74) *Attorney, Agent, or Firm* — Future IP LLC; Tomoko Nakajima

(57)          ABSTRACT

A vacuum evaporation method includes a vaporization step in which use is made of an evaporation boat including: a boat main body having a containing part of an evaporation material as an evaporation source; and electrode mounting plate parts respectively extending outward at both ends of the boat main body. A wire-shaped evaporation material is fed from above a bottom plate of the boat main body defining the containing part of the evaporation material, in a manner to come into contact with the bottom plate. Electric current is applied across both the electrode mounting plate parts in order to heat the boat main body, thereby evaporating the evaporation material inside the containing part. The vacuum evaporation method further includes a displacement step of continuously or intermittently displacing, while the wire-shaped evaporation material is being fed, a front end part of the wire-shaped evaporation material relative to the boat main body.

3 Claims, 7 Drawing Sheets

VACUUM EVAPORATION METHOD

TECHNICAL FIELD

The present invention relates to a vacuum evaporation method for vaporizing an evaporation material inside a vacuum chamber, thereby performing evaporation on an article to be evaporated (also called "to-be-evaporated article") and, in particular, relates to a method of performing evaporation on a to-be-evaporated article by using an evaporation boat.

BACKGROUND ART

Among evaporation sources for use in a vacuum evaporation apparatus that can perform this kind of vacuum evaporation method, there is known in patent document 1 an example in which an evaporation boat is employed. The evaporation source in question comprises: a boat main body having a containing part for containing therein an evaporation material; rising plate parts each rising upward from respective ends as seen in one direction of the boat main body; and electrode mounting plate parts each extending from an upper end of the respective rising plate parts outward. In order to reduce costs, and for the like purposes, ordinarily each part such as the boat main body, the rising plate parts, and the electrode mounting plate parts is formed by a single plate material made of metal. Then, the evaporation boat is placed in position into the vacuum chamber by respectively holding (pinching) it at a pair of the upper and the lower electrode plates. At the time of evaporation on a to-be-evaporated article inside the vacuum chamber in a vacuum atmosphere, the boat main body is heated by Joule heat by applying electric power by power source across both the electrode mounting plate parts through electrode plates. Then, when a wire-shaped evaporation material is fed from above a bottom plate of the boat main body in a manner to contact the bottom plate of the boat main body which defines the containing part, the evaporation material will be melted inside the containing part so as to get melted and spread therein. This melted and spread portion of the evaporation material will be vaporized, and this vaporized evaporation material will be splashed so as to be deposited onto the to-be-evaporated article. At this time, the melted and spread evaporation material will get fluidized in the containing part, and this fluidized material is prevented, by the rising plate parts, from crawling up (rising) to the electrode mounting plate parts.

Now, when the wire-shaped evaporation material is being fed to a predetermined position of the bottom plate of the boat main body during evaporation processing, depending on the material of the boat main body, the heating temperature of the boat main body in response to the evaporation rate, the feeding speed of the evaporation material and the kind of the evaporation material, the bottom plate will be locally deformed in a region inclusive of the position of contact of the evaporation material with the bottom plate of the boat main body. Then, it has been found that the amount of deformation at this time will soon become larger as the time of the evaporation processing increases, and that the bottom plate part will finally give rise to openings, thereby leading to a shortened lifetime of the evaporation boat.

PRIOR ART DOCUMENTS

Patent Documents

Patent Document 1: JP-2007-46106-A

SUMMARY OF THE INVENTION

Problems that the Invention is to Solve

This invention has been made in view of the above-mentioned points and has a problem of providing such a vacuum evaporation method as can prevent, to the extent possible, the progress of local deformation to occur in the evaporation boat, and thereby attaining a consequent prolonged lifetime of the evaporation boat.

Means for Solving the Problems

In order to solve the above-mentioned problem, a vacuum evaporation method for evaporating on a to-be-evaporated object by vaporizing an evaporation material inside a vacuum chamber comprises: a vaporization step of feeding a wire-shaped evaporation material including: by using as an evaporation source an evaporation boat having a boat main body with a containing part for the evaporation material, and electrode mounting plate parts respectively extending outward at both ends of the boat main body; feeding the wire-shaped evaporation material from above a bottom plate of the boat main body defining the containing part of the evaporation material in a manner to come into contact with the bottom plate; applying electric power across both the electrode mounting plate parts in order to heat the boat main body, thereby vaporizing evaporation material inside the containing part. The evaporation method further comprises a displacement step of continuously or intermittently displacing, while the wire-shaped evaporation material is being fed, the front end part of the wire-shaped evaporation material relative to the boat main body.

Here, as a result of strenuous efforts and studies by the inventors of this invention, they have obtained a finding that the local deformation to be generated in the bottom plate of the boat main body, in case the evaporation boat is made of a high-melting point metal and in case the evaporation material is made of copper, is attributable to the creep at high temperature (creep deformation) that is generated due to the action of the load to be generated by the feeding of the evaporation material. On the other hand, they have obtained a finding that, in case the evaporation boat is made of material by sintering the powders of BN and $TiB_2$ and the evaporation material is made of aluminum, the local deformation to be generated in the bottom plate of the boat main body is attributable to the progress of corrosion accompanied by the dissolving of aluminum. Then, in this invention, such a front end part of the wire-shaped evaporation material as will come into contact with the bottom plate of the boat main body at the time of feeding the evaporation material, is continuously or intermittently displaced. Therefore, during evaporation processing, the region in which, for example, the load to be brought about by the feeding of the evaporation material is acted will be dispersed into various places of the in-plane bottom plate. As a result, the development of local deformation to be generated in the evaporation boat can be restrained to the extent possible and, consequently, the evaporation boat can be prolonged in its lifetime.

By the way, it is known that, at the time of feeding the wire-shaped evaporation material, from above the bottom plate of the boat main body which defines the containing part so as to vaporize the evaporation material (during evaporation processing), by-products (impurities) of the evaporation material will be precipitated around the evaporation material that has been wet and spread. If these precipitates get deposited without being evaporated again, the deposited material will form a flood wall so as to narrow the area for the evaporation material (melted surface of evaporation material) to get spread, resulting in a disadvantage of decline in the evaporation rate. Further, if heating is made in the absence of the evaporation material in the containing part, the bottom plate of the boat main body will be heated substantially uniform over the entire surface thereof, but in a state in which the evaporation material has been supplied, the temperature of such bottom plate part as has present therein the evaporation material that has been wet and spread will be lowered, whereby the temperature in the surrounding area will become relatively high (i.e., there will arise a temperature gradient in the bottom plate plane of the boat main body). Particularly, under conditions in which the contact between the evaporation material and the bottom plate of the boat main body gives rise to a solid phase and a bearing stress, the temperature gradient becomes remarkable. At that time, depending on the state of deposit of the by-products, the evaporation material that has been wet and spread will be fluidized to the bottom plate part of the boat main body that has attained a relatively high temperature. There will be a disadvantage in that bumping may take place so as to inhibit good evaporation (deposition).

According to this invention, provided that: two axis directions extending perpendicularly to each other in an in-plane of the bottom plate of the boat main body defining the containing part are defined as an X-axis direction and a Y-axis direction, respectively, and that; such a position of the bottom plate of the boat main body as initially comes into contact with the front end part of the wire-shaped evaporation material is defined as an origin. In the displacement step, the front end part of the evaporation material keeps on sequentially repeating, from the origin, a relative movement in the X-axis direction and a relative movement in the Y-axis direction, and finally returning to the origin. In this case, for example, the neighborhood of the center of the bottom plate of the boat main body is defined as the origin. Then, by repeating the relative movement from the origin in the X-axis direction and the relative movement in the Y-axis direction, the time interval to returning to the origin is defined as one cycle. This one cycle is repeated for a plurality of times depending on the evaporation time.

According to the above arrangement, in the course of the relative movement within one cycle, in such a manner that the coordinate positions on the X-Y level do not overlap with each other, the position in which the front end part of the evaporation material gets melted in the in-plane bottom plate of the boat main body is continuously or intermittently varied. In this manner, the occurrence of a temperature gradient in the in-plane bottom plate plane of the boat main body can be restrained. It is thus difficult for the by-products to get deposited and, in turn, the occurrence of the bumping can be restrained to the extent possible. Even conceding that the precipitated by-products should have been deposited, the by-products in question will be pushed out (or set aside) to the periphery of the bottom plate of the boat main body by the evaporation material that will be solved and expand by wetting at the time when the front end part of the evaporation material is relatively reached in the next cycle. As a result, during evaporation processing, it becomes possible to secure the area of the melted surface substantially constant. By the way, the relative movement speed of the front end part of the evaporation material relative to the boat main body can be set to a range, e.g., of 1 mm/sec to 1000 mm/sec. Further, the amount of displacement in the X-axis direction and in the Y-axis direction may be set to a range of 60% to 80% of the total length in the X-axis direction and in the Y-axis direction so as to secure a region in which the by-products can be deposited in the periphery of the bottom plate of the boat main body.

MODES FOR CARRYING OUT THE INVENTION

With reference to the drawings, description will be made of an embodiment of an evaporation source BS for use in a vacuum evaporation apparatus of this invention based on an example in which a copper film is evaporated on a deposition surface of a substrate Sg in a vacuum chamber while feeding an evaporation material Em to thereby vaporize it, on condition: that an article (hereinafter called "a substrate Sg") to receive thereon evaporated particles is a square glass substrate; that an evaporation material Em is made of copper formed into a wire shape; and that, while feeding the evaporation material Em and allow it to be evaporated, a copper film is vapor-deposited on a film-forming surface of the substrate Sg inside a vacuum chamber. In the following descriptions the terms showing the direction such as up (or upper), down (or lower) shall be based on FIG. 1 which shows an installed posture of the evaporation source BS.

Figure 1:
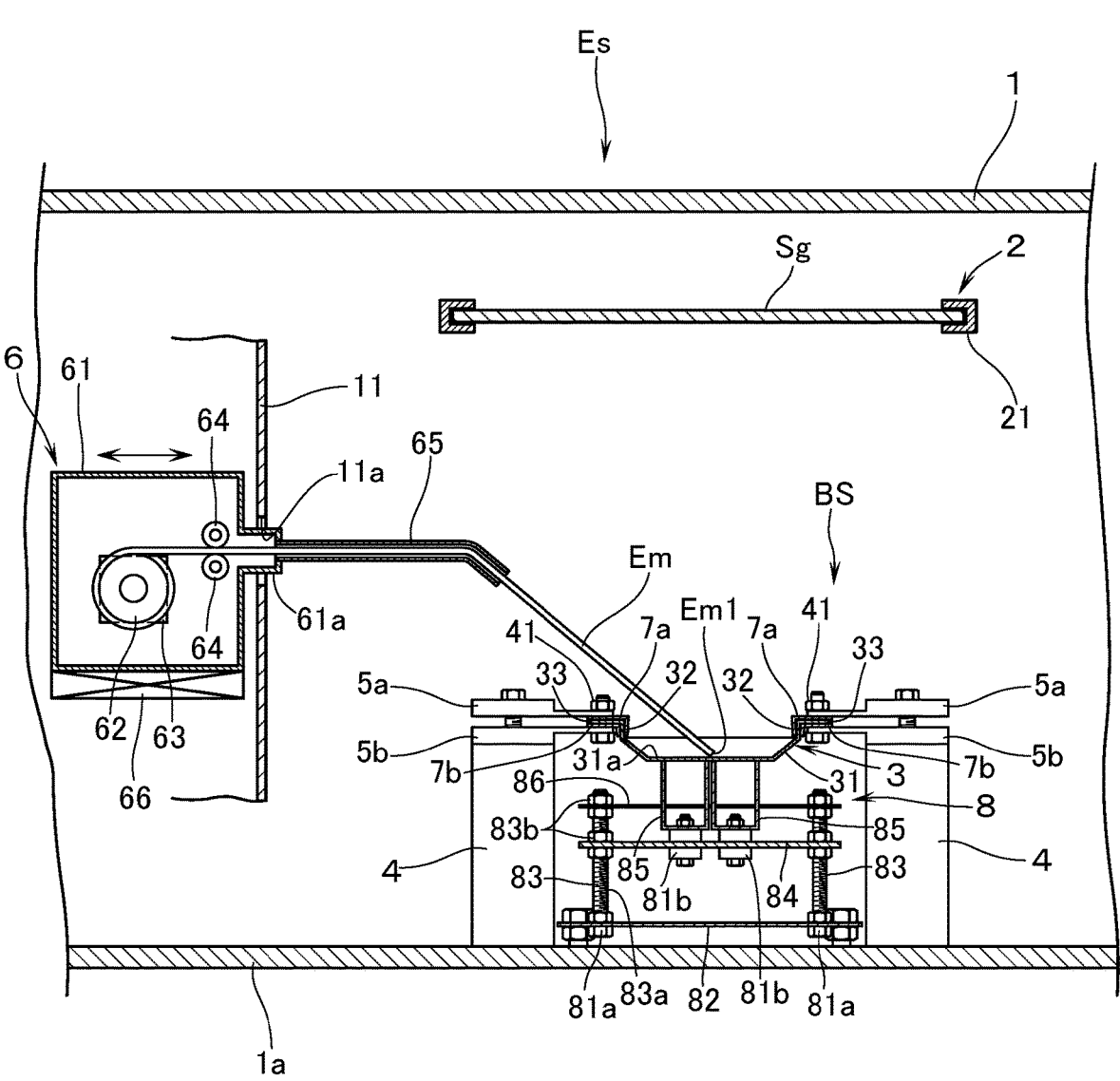
FIG. 1 is a sectional view showing an arrangement of an inline-type of vacuum evaporation apparatus equipped with an evaporation source according to this embodiment.

With reference to FIG. 1, an in-line type of vacuum evaporation apparatus Es is provided with a vacuum chamber 1. The vacuum chamber 1 has connected thereto a vacuum pump through an exhaust pipe (not illustrated) so that the inside of the vacuum chamber can be evacuated to a predetermined pressure (vacuum degree), thereby forming a vacuum atmosphere. In an upper space of the vacuum chamber 1, there is provided a substrate transport apparatus 2. The substrate transport apparatus 2 has a carrier 21 for holding the substrate Sg in a state in which the lower surface, serving as a surface on which a film is to be evaporated, of the substrate is left open. By means of a driving apparatus (not illustrated) the carrier 21 and consequently the substrate Sg can be transported at a predetermined speed in one direction inside the vacuum chamber 1. Since a known apparatus can be used as the substrate transport apparatus 2, further description thereof will be omitted. In a manner to face the substrate Sg that is to be transported in one direction, the evaporation source BS according to this embodiment is disposed in a space inside the vacuum chamber 1.

Figure 2A:
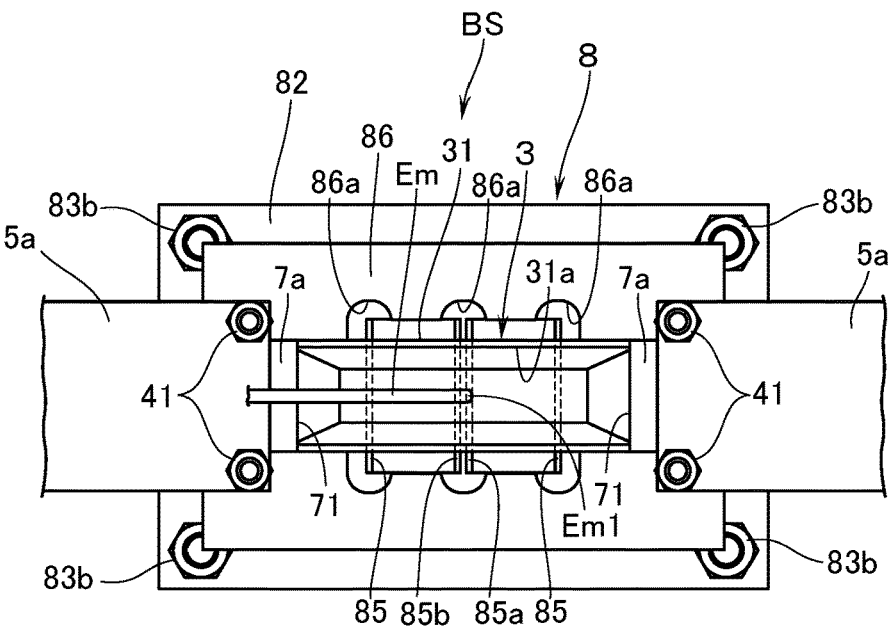
FIG. 2($a$) is an enlarged plan view of the evaporation source shown in FIG. 1 and FIG. 2($b$) is an enlarged sectional view of the evaporation source.
Figure 2B:
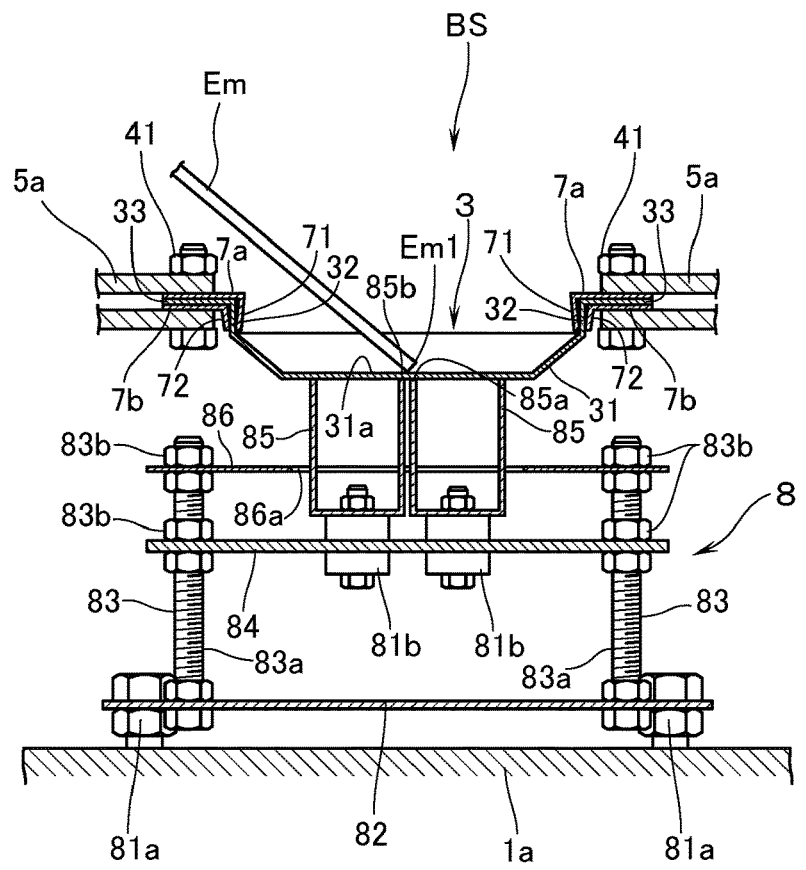

With reference also to FIG. 2, the evaporation source BS is provided with an evaporation boat 3. The evaporation boat 3 is provided with: a boat main body 31 having a recessed part 31a, as a containing part with a flat bottom surface, for containing therein the evaporation material Em; rising plate parts 32 each rising upward substantially at right angles on both longitudinal (left and right direction in FIG. 1) ends of the boat main body 31; and electrode mounting plate parts 33 each extending horizontally outward from respective upper ends of both the rising plate parts 32. In this embodiment, the evaporation boat 3 is made of a metal plate material having a high-melting point than does the evaporation material Em and, specifically, is formed by integrally press-working a plate having a constant thickness within a range of 0.3 mm to 3 mm. As the "high-melting point metal" referred to in this invention, there can be listed molybdenum, tungsten and tantalum. Among them is included a metal having the main ingredients of either one kind of molybdenum, tungsten and tantalum (e.g., molybdenum having added thereto yttrium oxide in a predetermined weight percentage).

On the inner surface of the lower wall 1a of the vacuum chamber, there are installed two supporting platforms 4, 4 which are constituted by an insulating material at a distance from each other as seen in the longitudinal direction. On an upper surface of the supporting platforms 4, 4 there are installed a pair of upper and lower electrode plates 5a, 5b made of a metal of good conductivity such as copper in such a manner that each of the electrode mounting plate parts 33 of the evaporation boat 3 is detachably mounted by pinching them in a vertical direction by means of a fastening means 41 such as bolts and the like. In this case, such parts of the electrode plates 5a, 5b as will pinch the electrode mounting plate parts 33 have a far wider width than do the electrode plates 5a, 5b so that the electrode mounting plate parts 33 can be kept in close contact with each other over the entire surface thereof. The electrode mounting plate parts 33 can thus be fastened by the fastening means 41 on both sides of the electrode mounting plate parts 33. In a state of having mounted the electrode plates 5a, 5b while pinching the electrode mounting plate parts 33, the evaporation boat 3 is installed at a predetermined height position from the inner surface of the lower wall 1a of the vacuum chamber in a posture in which the bottom plate of the boat main body 31, defining the recessed part 31a, becomes horizontal.

Inside the vacuum chamber 1 there is provided a material feeding means 6 for continuously or intermittently feeding the wire-shaped evaporation material Em into the recessed part 31a of the boat main body 31. The material feeding means 6 is provided with a casing 61 which is disposed on such a side of a deposition preventing plate 11 as lies to oppose the evaporation source BS. The casing 61 has housed therein a feed roller 62; an electric motor 63 for driving, by rotation, the feed roller 62; and a pair of upper and lower guide rollers 64, 64. A side wall, positioned on the side of the evaporation source BS, of the casing 61 has formed therein a protruded tube part 61a. The casing 61 is installed inside the vacuum chamber 1 in such a manner that the protruded tube part 61a passes through a penetrating opening 11a. A front end of the protruded tube part 61a has mounted therein a guide tube 65 of a predetermined length bent into an articulated manner so as to guide the wire-shaped evaporation material Em toward a recessed part 31a of the boat main body 31. As the evaporation material Em there is used one formed into an outside diameter of 1 mm to 5 mm, which is wound around the feed roller 62 in advance. Then, the front end of the wire-shaped evaporation material Em that is wound around the feed roller 62 is pulled out to pass it through the pair of the upper and the lower guide rollers 64, 64 so as to pass from the space inside the protruded tube part 61a through the inside of the guide tube 65. The wire-shaped evaporation material Em is prepared in such a manner that the front end part Em1 of the evaporation material Em that has been protruded out of the guide tube 65 is arranged to come into contact, from an upper side, with an inner bottom surface (the bottom plate of the boat main body 31) in the central region of the recessed part 31a as seen in the longitudinal direction thereof.

When a copper film is formed on the lower surface of the substrate Sg inside the vacuum chamber 1 in a vacuum atmosphere by using the above-mentioned evaporation boat 3 (i.e., in the vacuum evaporation method of this embodiment), electric current is applied from a power source (not illustrated) to the electrode plates 5a, 5a across both the electrode mounting plate parts 33, 33, thereby heating the boat main body 31 by Joule heat. After a lapse of a predetermined time, the feed roller 62 is driven for rotation by the electric motor 63 so as to feed the wire-shaped evaporation material Em at a predetermined speed. According to these operations, such a front end part Em1 of the evaporation material Em as is in contact with the inner bottom surface of the recessed part 31a is gradually melted to get wet and spread, and this wet-and-spread portion will be vaporized (vaporization step). Then, as a result of splashing of the vaporized evaporation material Em, a copper film is deposited on a lower surface of the substrate Sg that is moving in one direction. At this time, the wet and spread evaporation material Em will be fluidized in the recessed part 31a, but this fluidized evaporation material is prevented by the rising plate parts 32 from creeping up to the electrode mounting parts 33. By the way, the evaporation rate is set to a range, e.g., of 200 mm/min to 2000 mm/min.

Figure 3:
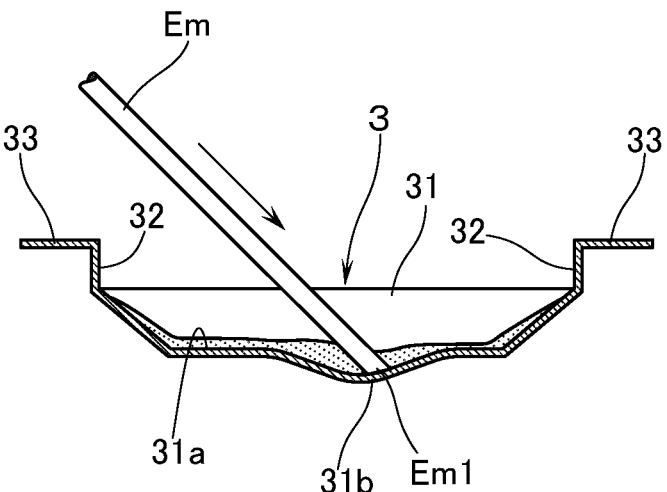
FIG. 3 is a figure to explain a creep deformation that occurs to the boat main body.

By the way, when the wire-shaped evaporation material Em is fed to a predetermined position on the inner bottom surface of the recessed part 31a, at the time of evaporation, depending on the heating temperature of the boat main body 31, and the feeding speed of the evaporation material Em, according to the evaporation rate, as shown in FIG. 3, the bottom plate part 31b of the boat main body 31 defining the recessed part 31a will be deformed downward. The deformation thus occurring to the bottom plate part 31b is due to creep at high temperature (creep deformation) that occurs by the function of the load to be brought by the supply of evaporation material Em. Then, if the amount of deformation at this time becomes larger with an increase in the evaporation time, the bottom plate part 31b of the boat main body 31 will sooner or later give rise to openings (holes). In addition, with the increase in the evaporation time, the entire deformation will progress from the electrode mounting plate parts to the boat main body 31. Depending on cases, there will be a rupture in the rising plate parts 32, this rupture bringing about a shorter lifetime of the evaporation boat 3.

Figure 4:
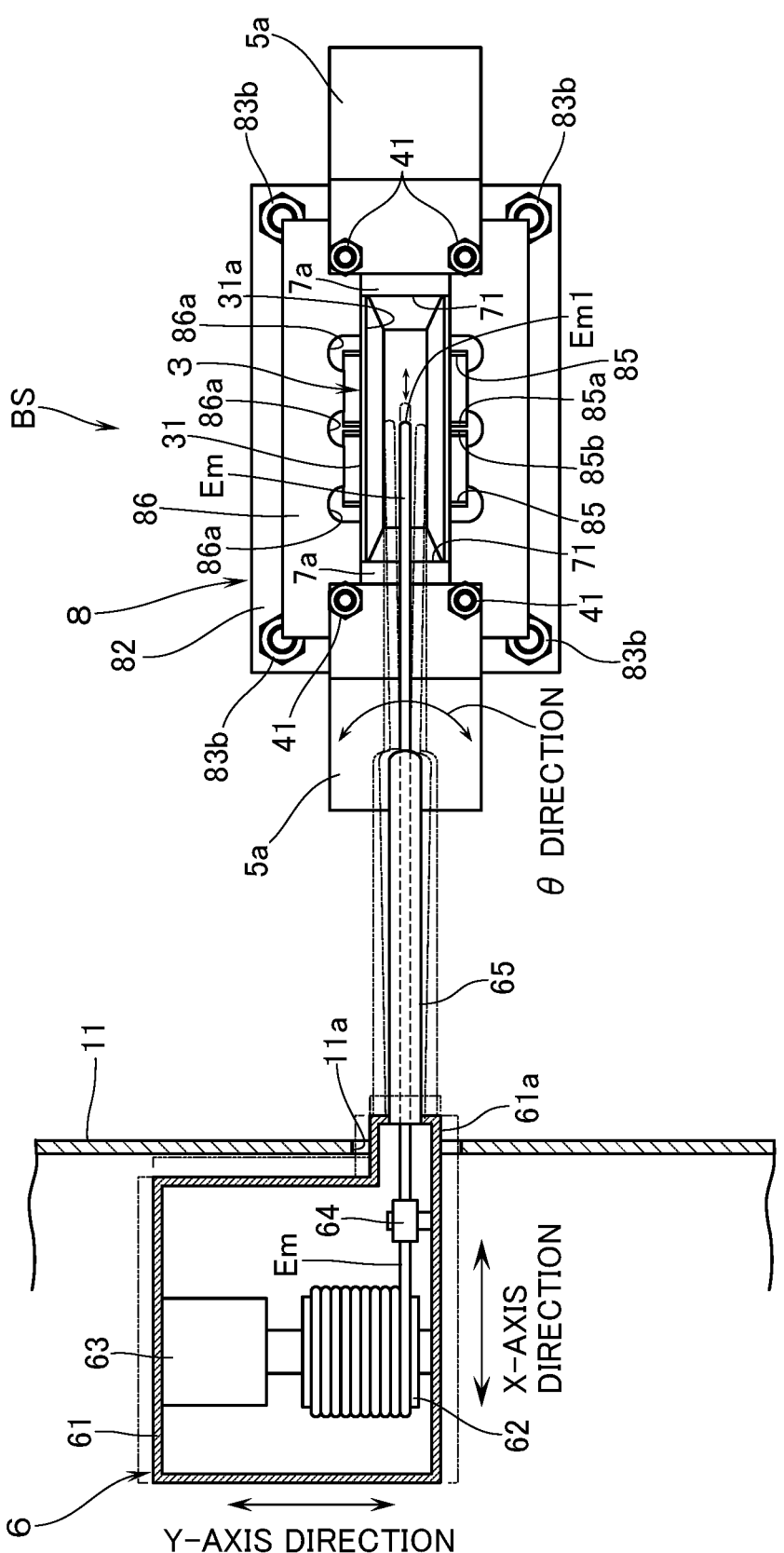
FIG. 4 is a figure to explain a deformation at the front end part of the evaporation material, in a manner to correspond to FIG. 2($a$).

In this embodiment, it was arranged to install the casing 61 on an XYθ stage 66. During evaporation processing, the casing 61 was reciprocated by means of the XYθ stage 66, as shown in FIG. 4, in one of the X-axis direction which is the longitudinal direction of the boat main body 31, Y-axis direction which is perpendicular to the X-axis direction, and θ-axis direction which has the center of the casing 61 as the center of rotation. In this manner, as a result of the relative movement of the front end part Em1 of the wire-shaped evaporation material Em that comes into contact with the inner bottom surface of the recessed part 31a, the front end part Em1 was arranged to be displaced either continuously or intermittently (displacement step). As to the amount of displacement at this time, there is no particular limitation as long as the parts other than the front end part Em1 of the evaporation material Em do not interfere with other parts such as the pair of the upper and the lower electrode plates 5a, 5b, and as long as the region on which the above-mentioned load operates can be dispersed. However, by displacing the front end part Em1, the evaporation material Em is dissolved so that the area of melted metal surface (area of melted surface) varies, the rate of evaporation may fluctuate as compared with the case in which the wire-shaped evaporation material Em is fed to a predetermined position of the inner surface of the recessed part 31a. Taking this circumstance into consideration, the displacement direction and the displacement amount shall preferably be set. For example, let us define an origin be such a position in the central region in the X-axis direction of the recessed part 31a as will first come into contact with the front end part Em1 of the evaporation material Em (i.e., the position in the neighborhood of the center of the bottom plate of the boat main body 31 defining the recessed part 31a). In case reciprocating movements are made with equal amounts of movement (amounts of displacement) in the X-axis direction and in the Y-axis direction of the boat main body 31, the amounts of movements can be set within a range of 80%, preferably 60%, of the length in the X-axis direction and of the width in the Y-axis direction. According to this arrangement, the region to be influenced by the load as a result of feeding of the wire-shaped evaporation material Em is dispersed into several places of the inner bottom surface of the recessed part 31a. Therefore, the progress of local deformation to be generated in the bottom surface of the recessed part 31a is prevented to the extent possible, and consequently the prolonged lifetime of the evaporation boat 3 can be attained.

By the way, it is known that, during the evaporation processing, by-products (impurities) of the evaporation material Em are precipitated in the periphery of the melted metal surface. If these precipitated by-products get deposited without vaporization once again, the area of the dammed (or retained) surface of the melted material will sometimes be narrowed by getting banked up by the deposited material, thereby bringing about a disadvantage in that the evaporation rate becomes lowered. Further, in the above-mentioned evaporation boat 3, if heating is made in a state in which the containing part 31a has no evaporation material Em therein, the bottom plate 31b of the boat main body 31 defining the containing part 31a will be heated substantially uniformly over the entire surface thereof. However, in a state in which the evaporation material Em has been fed, such a bottom plate part 31b of the boat main body 31 as has present therein the wet and spread evaporation material Em will be lowered in temperature and the periphery thereof will become relatively higher in temperature (i.e., there will be formed a temperature gradient in the in-plane of the bottom plate of the boat main body 31). Particularly, under conditions in which the contact of the evaporation material Em with the bottom plate of the boat main body 31 will give rise to a solid phase and a bearing stress, the temperature gradient will become conspicuous. At that time, depending on the conditions of deposition of the by-products, there will be cases in which the wet and spread evaporation material Em will be fluidized up to the bottom plate part 31b of the boat main body 31 that has already attained a relatively high temperature. There will then be a disadvantage in that, due to the possible occurrence of bumping, favorable evaporation will be impaired.

Figure 5:
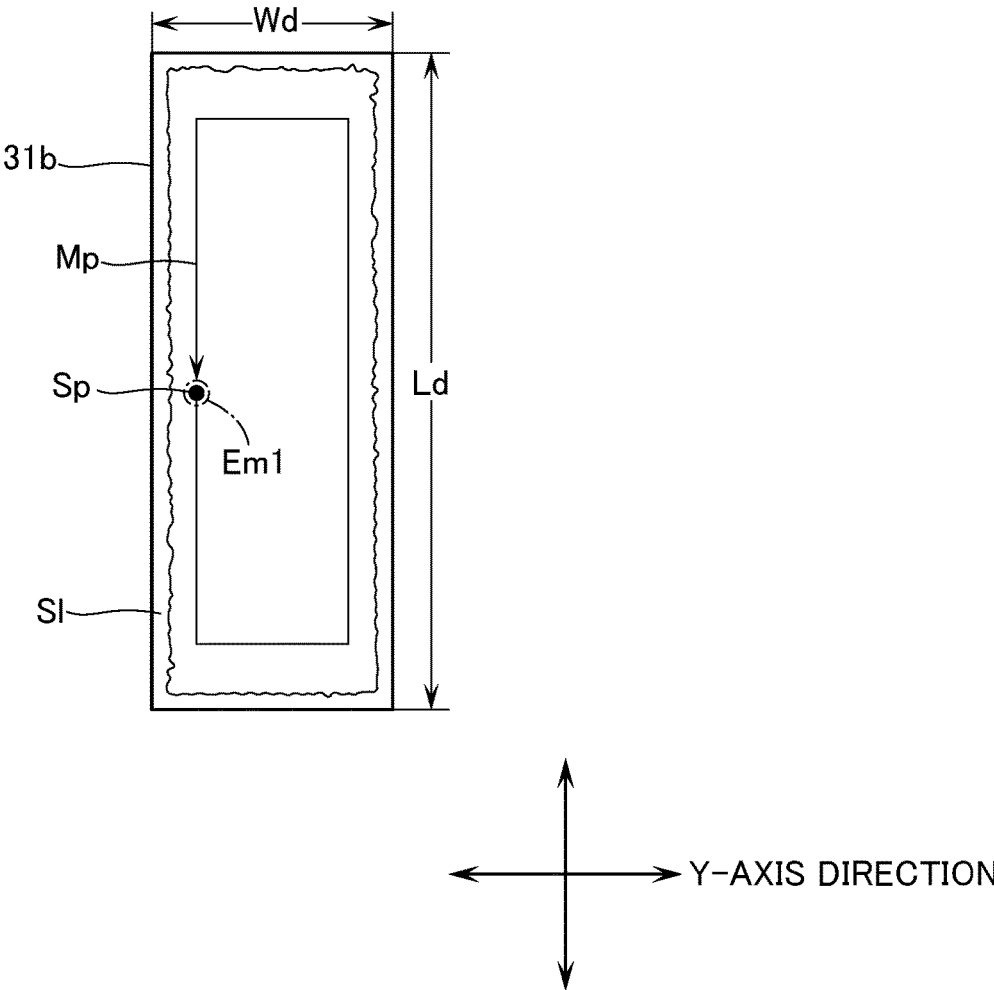
FIG. 5 is a figure to explain a deformation at the front end part of the evaporation material.

In case there is a possibility of deposition of the by-products during the evaporation processing, as shown in FIG. 5, let us define an origin be such a position in the central region Sp of the bottom plate of the boat main body 31 with which the front end part Em1 of the evaporation material Em initially comes into contact. Displacement can be made by sequentially repeating the relative movements by the front end part Em1 from the origin in the X-axis direction and the relative movements in the Y-axis direction (i.e., by drawing a rectangular locus Mp), then coming back to the origin Sp. Defining the time until coming back to the origin Sp as one cycle, this one cycle is repeated for a plurality of times depending on the evaporation time. The relative speed of movement of the front end part Em1 of the evaporation material Em relative to the boat main body 31 can be set within a range, e.g., of 1 mm/sec to 1000 mm/sec. Further, the amount of displacement in the X-axis direction and in the Y-axis direction may be in a range of 60% to 80% of the total length Ld in the X-axis direction and the total width Wd in the Y-axis direction so as to secure a region in which the by-products SI are accumulated in the peripheral part of the bottom plate of the boat main body 31.

Figures 6A, 6B, 6C:
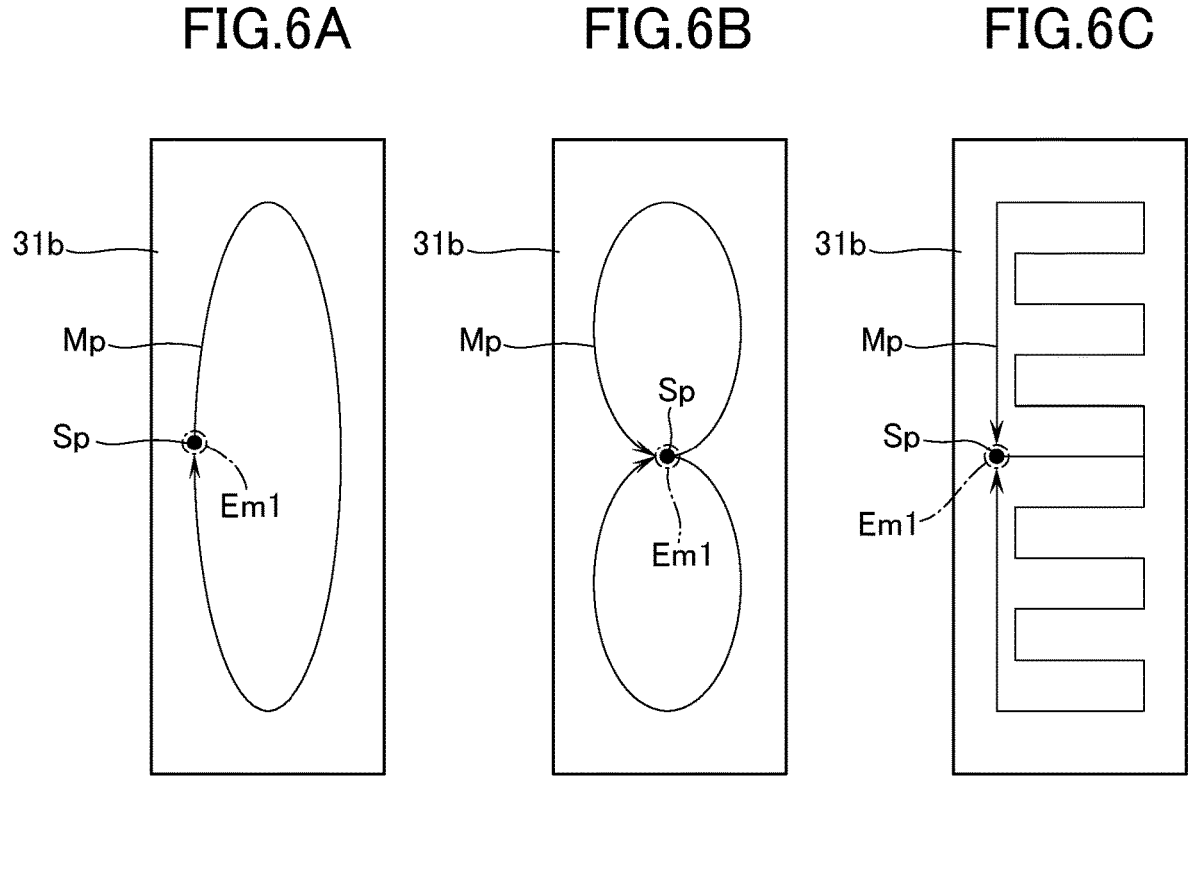
FIG. 6($a$) to FIG. 6($c$) are figures to explain modified examples of the displacement at the front end part of the evaporation material.

As described above, in a manner that the coordinate position on the X-Y plane does not overlap during the relative movement within one cycle, the front end part Em1 of the evaporation material Em is varied continuously or intermittently in the in-plane of the bottom plate 31b of the boat main body 31. Consequently, generation of the temperature gradient in the in-plane of the bottom plate 31b of the boat main body 31 can be restrained, the by-products SI are difficult of getting deposited and, as a result, the occurrence of the bumping can be restrained to the extent possible. Even if the precipitated by-products SI should have been deposited, when the front end part Em1 of the evaporation material Em is relatively moved in the next cycle, the by-products SI will be pushed out by the evaporation material Em that has been melted and expanded by wetting toward the peripheral side of the bottom plate 31b of the boat main body 31. As a result, it becomes possible, during evaporation processing, to secure the area of the melted surface substantially constant. In this embodiment, descriptions will be made of an example in which the front end part Em1 of the evaporation material Em is displaced in such a manner as to draw a locus Mp of a rectangle, but this invention shall not be limited thereto. By the way, the description in this application to the effect that "while sequentially repeating the relative movement in the X-axis direction and the relative movement in the Y-axis direction" shall be understood to include the movement in an arcuate manner. For example, as shown in FIG. 6(a), the front end part Em1 of the evaporation material Em may be displaced in a manner to draw a locus Mp of an ellipse (oval will do as well), or as shown in FIG. 6(b), the front end part Em1 of the evaporation material Em may be displaced in a manner to draw an oblong locus Mp which is symmetrical with the origin as a reference. Further, as shown in FIG. 6(c), the front end part Em1 of the evaporation material Em may be displaced in a manner to draw a comb-shaped locus Mp.

Figure 7:
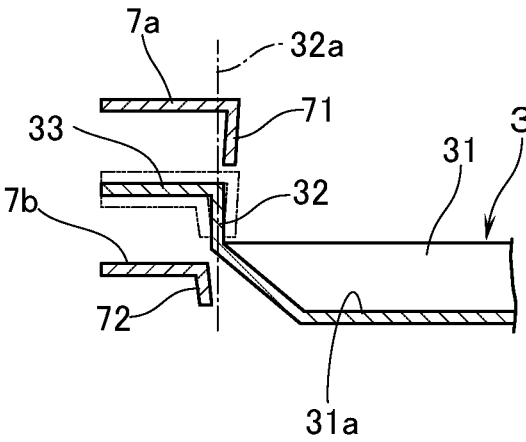
FIG. 7 is a partially expanded figure to explain how the reinforcing plates are mounted on the erection plate parts.

In addition, according to this embodiment, in order to further restrain the deformation of the evaporation boat 3, two pieces of reinforcing plates 7a, 7b that have been formed out of a piece of plate material into L-shape such that the rising plate parts 32 and the electrode mounting plate parts 33 coincide with each other in outline. When the reinforcing plates are mounted in position on the electrode plates 5a, 5b, a pair of the reinforcing plates 7a, 7b sandwich (or pinch) the electrode plates 33 and the rising plate parts 32 from both sides as seen in plate thickness direction (from a vertical direction). As the reinforcing plates 7a, 7b, there may be used one made of a high-melting point metal. In this case, as shown in FIG. 7, relative to the rising plate parts 32 and the electrode mounting plate parts 33, such downwardly bent parts 71 of one 7a of the reinforcing plates as are mounted from above is inclined toward the rising plate parts 32 relative to an extension line 32a, that passes through the rising plate parts 32, within a range of predetermined angle (e.g., 2 degrees to 10 degrees). Further, a downwardly bent parts 72 of the other 7b of the reinforcing plates is inclined, relative to the extension line 32a, toward the rising plate parts 32 within a range of predetermined angle (e.g., 2 degrees to 10 degrees). According to this arrangement, without the need of using a particular fixing means such as bolts and the like for integrating and pinching the reinforcing plates 7a, 7b to the rising plate parts 32 and the electrode mounting plate parts 33, the rising plate parts 32 can be surely pinched by a pair of the reinforcing plates 7a, 7b from both sides as seen in the plate thickness direction.

According to the above-mentioned arrangement, when the wire-shaped evaporation material Em is fed into, and melted in, the recessed part 31a of the boat main body 31 that is under heated conditions, even if the electric resistance value of the boat main body 31 may be decreased, the pair of reinforcing plates 7a, 7b serve the purpose of dividing passages for the applied electric current. The electric resistance value of the rising plate parts 32 can thus be restrained from relatively rising, so that overheating of the rising plate parts 32 can be restrained to the extent possible. Further, since the electrode mounting plate parts 33 and the rising plate parts 32 are reinforced by the pair of the reinforcing plates 7a, 7b, the evaporation boat 3 can still further be prevented from deformation. As a result, the evaporation boat 3 can be prevented from getting locally overheated or deformed, thereby contributing to the extension of the lifetime of the evaporation boat 3. In this case, in order for the electric resistance value at the rising plate parts 32 to be equivalent to the electric resistance value of the boat main body 31 during evaporation processing, the sectional area of each of the reinforcing plates 7a, 7b shall preferably be set accordingly. According to this arrangement, during evaporation processing, the boat main body 31 and the rising plate parts 32 can be made equivalent to each other in temperature. As a result, even if the melted evaporation material Em, melted inside the recessed part 31a during evaporation processing, were to crawl up to the rising plate parts 32, the crawled up evaporation material Em will also be quickly vaporized. Consequently, the evaporation material Em can be prevented from getting accumulated at the rising plate parts 32 and, in addition, the change in the evaporation rate can also be restrained. By the way, once the rising plate parts 32 get overheated, bumping may occur when the melted evaporation material Em crawls up into contact with the rising plate parts 32. But since the overheating of the rising plate parts 32 is prevented, the occurrence of the bumping can also be restrained.

Further, in this embodiment, supporting means 8 is disposed in a manner to contact the bottom plate part 31b from the lower side thereof. The supporting means 8 is provided with a first base plate 82 which is installed horizontally by interposing first insulators 81a on the inside of the lower wall 1a of the vacuum chamber, the supporting means being positioned on the inner side of both the supporting platforms 4, 4. The first base plate 82 has vertically installed two supporting columns 83, 83 which extend upward. Then, at a predetermined height position from the inner surface of the lower wall 1a of the vacuum chamber, there is provided a second base plate 84, by being supported by each of the supporting columns 83. The second base plate 84 is provided with supporting plates 85 whose upper ends come into contact with the lower surface of the boat main body 31 by interposing second insulators 81b. The supporting plates 85 have a larger width (in the vertical direction as seen in FIG. 2(a)) than does the boat main body 31, and is formed by bending, into a shape of "E" (trough), a piece of high-melting point metal having a plate thickness in the range of 0.1 mm to 2 mm. In this embodiment, two pieces of the above-mentioned bent supporting plates 85 are installed in parallel with each other in the following postures, i.e.: in a posture in which two pieces of the bent supporting plates 85 are arranged so that both the free ends 85a, 85b face the recessed part 31a side; in a posture in which one of the free ends, that are adjacent to each other, of each of the supporting plates 85, 85 faces the recessed part 31a side; and also in a posture in which the width-direction of each of the supporting plates 85, 85 coincides with the direction orthogonal to the longitudinal direction of the boat main body 31. In this case, the clearance in the longitudinal direction between the free ends 85a, 85b is appropriately set depending on the deformation range of the bottom plate part 31b.

By being supported by each of the supporting columns 83, a reflector plate 86 having an area equivalent to the bottom surface of the evaporation boat 3 is disposed at a predetermined height from the second base plate 84. The reflector plate 86 is constituted by a high-melting point metal plate material having a plate thickness in a range of 0.1 mm to 2 mm. In this case, such a surface of the reflector plate 86 as faces the boat main body 31 may be subjected to a mirror finish. Further, the reflector plate 86 has formed therein a slit 86a so as to enable the supporting plates 85, 85 to be inserted through the slit. In this embodiment, the supporting columns 83, 83 are provided on their external surfaces with screw threads 83a so that a plurality of nut members 83b are in threaded engagement with the screw threads 83a. In this case, the second base plate 84 and the reflector plate 86 have formed through holes (not illustrated) which penetrate in the plate thickness direction. It is thus so arranged that: the supporting columns 83, 83 can be inserted into the through holes for positioning thereof by means of the nut members 83b which form a pair in the vertical direction and that; the height position of the second base plate 84 and the reflector plate 86 relative to the boat main body 31 can be appropriately fine-adjusted.

According to the above-mentioned arrangement, in case, for example the front end part Em1 of the evaporation material Em is relatively moved in the X-axis direction relative to the boat main body 31, thanks to the free ends 85a, 85b of the supporting plates 85, the bottom plate part 31b on which is acted the load to be caused to occur by the feeding of the evaporation material Em is always supported. The progress of the creep deformation is thus further restrained, so that the prolonged lifetime of the evaporation boat 3 can be attained. At this time, by constituting the supporting means 8 as described above, the area of contact of the supporting means with the bottom plate part 31b can be made small to the extent possible. In addition, since the two pieces of flexed (or bent) supporting plates 85, 85 are arranged in parallel with each other, the other free end of each of the supporting plates 85, 85 will support both the longitudinal ends (parts other than the bottom plate part 31b). Therefore, the deformation in the entire boat main body 31 can be reduced and, during evaporation processing, the boat main body 31 can be held substantially horizontal all the time. In addition, since the reflector plate 86 is further provided, in case bumping should occur inside the recessed part 31*a* of the boat main body 31 due to some causes or others during evaporation processing, there can be surely prevented such an occurrence as an electric insulation breakdown as a result of adhesion of the evaporation material Em in the liquid state or solid state that is caused to occur by the bumping inside the recessed part 31*a* of the boat main body 31. Still furthermore, as a result of reflection of radiation heat from the boat main body 31, in case some parts or others such as piping or wiring are disposed in the lower space of the boat main body 31, such parts can advantageously be protected from the heat.

Descriptions have so far been made of the embodiments of this invention but, as long as the technical concept of this invention is not deviated from, various modifications are possible. In the above-mentioned embodiments, descriptions have been made based on examples in which constituting parts such as feed roller 62, electric motor 63, guide rollers 64, 64 and the like are enclosed in the casing 61, and in which the casing 61 is disposed on the XYθ stage 66 so as to displace the front end part Em1 of the evaporation material Em, but the invention shall not be limited to the above. In order to cope with the construction of the material feeding means 6, for example, the feed roller 62 and the guide rollers 64 themselves can be provided with a known moving mechanism, or otherwise the guide tube 65 is provided with a known oscillation mechanism so as displace the front end part Em1 of the evaporation material Em. On the other hand, it may also be so arranged that the supporting platforms 4, 4 to support the evaporation boat 3 may be provided with a known driving mechanism so that, by the relative movement of the evaporation boat 3 relative to the front end part of the wire-shaped evaporation material, the front end part Em1 may be continuously or intermittently displaced.

By the way, when the oscillation mechanism is disposed so as to displace the front end part Em1 of the evaporation material Em, it is preferable to make it capable of controlling the feeding amount of the evaporation material Em by the feed roller 62, the motor 63, and the guide rollers 64 so that the feeding amount can be corrected by means of the oscillation (i.e., so that the feeding amount per unit time becomes constant). For example, an amount of increase or decrease in the feeding amount of the evaporation material Em depending on the angle of oscillation is calculated by a high-end control system. The feeding amount of the evaporation material Em to be measured by the guide rollers 64 may be controlled so that the motor 63 causes the feed roller 62 to rotate to coincide with the above-mentioned amount of increase or decrease. Further, as to the driving of respective axes of the XYθ stage 66, it is preferable to constitute: that the protruded tube part 61*a* having inserted therethrough the penetrating opening 11*a* that is formed in the deposition preventing plate 11, is driven not to interfere with the penetrating opening 11*a*; and that the penetrating opening 11*a* becomes minimum. By controlling in this manner, the clearance between the penetrating opening 11*a* and the protruded tube part 61*a* can be minimized, thereby decreasing the unnecessary film deposition. As a matter of course, even in a case in which the XYθ stage 66 is provided with an oscillating mechanism and the stage arrangement is made to have 4 axes or more, it is preferable to control the driving so as to make the clearance minimum.

Further, in the above-mentioned embodiments, descriptions were made of an example in which the evaporation material Em was made of copper, and the evaporation boat 3 was made of high-melting point metal. However, this invention shall not be limited to the above. The vacuum evaporation method of this invention is widely applicable to a case in which a local deformation progresses in the evaporation boat when a wire-shaped evaporation material is fed to a certain position of the bottom plate of the boat main body at the time of evaporation processing depending on the material of the evaporation material Em, and depending on the material of the evaporation boat 3, and the like. For example, in case the evaporation boat is supposed to be made by sintering the powder of BN and $TiB_2$, and evaporation material is supposed to be made by sintering the powder of aluminum, the bottom plate of the boat main body will be reduced in thickness accompanied by the progress in the corrosion accompanied by the melting of the aluminum and resultant reduction in plate thickness. Due to this phenomenon, local deformation will develop. But by applying this invention, the evaporation boat can be prolonged in its lifetime.

In the above-mentioned embodiments, descriptions were made of an example in which dividing passages are constituted by a pair of reinforcing plates 7*a*, 7*b*. But this invention shall not be limited thereto if the electric resistance value of the rising plate parts 32 can be restrained from becoming high during the evaporation processing. For example, the boat main body 31 and the electrode mounting plate parts 33 may be connected in parallel with each other with the electrical conductive parts such as cables or bus bars, thereby forming the dividing passages of the rising plate parts 32. Further, in the above-mentioned embodiments, descriptions were made of an example in which the reinforcing plates 7*a*, 7*b* are partly inclined relative to the rising plate parts 32, so as to pinch the rising plate parts 32 with a pair of the reinforcing plates 7*a*, 7*b*. This invention shall, however, not be limited thereto. For example, after having installed a pair of reinforcing plates 7*a*, 7*b* on both sides, as seen in the plate thickness direction of the rising plate parts 32 and the electrode mounting plates parts 33, the reinforcing plates 7*a*, 7*b* may be fastened by bolts and the like made of high-melting point metal or by spot welding to thereby integrate them so as to pinch the rising plate parts 32.

Further, in the above-mentioned embodiments, descriptions were made, as the supporting means 8, of two pieces of supporting plates 85, 85 bent into the shape of a "E" (trough) are arranged in parallel with each other. However, it shall not be limited to the above as long as the bottom plate part 31*b*, on which is operated the load to be brought by the feeding of the evaporation material Em, can be supported by contact, from the lower side, with the bottom plate part 31*b*. For example, a beam member which is circular in cross section or in an ellipse may be disposed in a manner to bridge the bottom plate part 31*b* so as to support the bottom plate part 31*b*. Or else, a plurality of columnar members may be vertically installed on the supporting plates 85 so as to support the bottom plate part 31*b*. By the way, in case the supporting means 8 is provided, this invention may also be applicable to a shape having no rising plate parts 32 as the evaporation boat 3. Still furthermore, in the above-mentioned embodiments, descriptions were made of examples in which the free ends 85*a*, 85*b* of the supporting plates 85 are installed in parallel in a posture to coincide orthogonally with the longitudinal direction of the boat main body 31. However, this invention shall not be limited thereto but, depending on the direction of displacements of the front end part of the wire-shaped evaporation material Em when the evaporation material Em is fed, each of the supporting plates 85, 85 may be installed in a posture in which the width direction of each of the supporting plates 85, 85 coincides with the longitudinal direction of the boat main body 31.

EXPLANATION OF MARKS

BS evaporation source for vacuum evaporation apparatus
Em wire-shaped evaporation material
Em1 front end part of evaporation material
Es vacuum evaporation apparatus
Sg substrate (article to receive thereon evaporated particles, or to-be-evaporated article)
1 vacuum chamber
3 evaporation boat
31 boat main body
31a recessed part (part for containing therein evaporation material)
31b bottom surface part of the boat main body (bottom plate of the boat main body)
32 rising plate part
33 electrode mounting plate part
6 material feeding means
61 casing
Sp origin

What is claimed is:
1. A vacuum evaporation method for evaporating on a to-be-evaporated object by vaporizing an evaporation material inside a vacuum chamber, comprising:

feeding a wire-shaped evaporation material to a vacuum chamber, providing an evaporation boat as an evaporation source having a boat main body with a containing part for the evaporation material, and electrode mounting plate parts respectively extending outward at both ends of the boat main body;

feeding the wire-shaped evaporation material from above a bottom plate of the boat main body defining the containing part of the evaporation material in a manner to come into contact with the bottom plate, wherein the wire-shaped evaporation material is in a solid phase and the contact applies a bearing stress to the bottom plate;

applying electric power across both the electrode mounting plate parts in order to heat the boat main body, thereby vaporizing the evaporation material inside the containing part, and continuously or intermittently displacing the front end part of the wire-shaped evaporation material relative to the boat main body while the wire-shaped evaporation material is being fed to the vacuum chamber such that the movement restrains generation of a temperature gradient in the bottom plate of the boat main body.

2. The vacuum evaporation method according to claim 1, provided that two axis directions extending perpendicularly to each other in an in-plane of the bottom plate of the boat main body defining the containing part are defined as X-axis direction and Y-axis direction, respectively, and further provided that such a position of the bottom plate of the boat main body as initially comes into contact with the front end part of the wire-shaped evaporation material is defined as an origin, wherein, in the-continuously or intermittently displacing, the front end part of the evaporation material keeps on sequentially repeating, from the origin, a relative movement in the X-axis direction and a relative movement in the Y-axis direction, and finally returning to the origin.

3. A vacuum evaporation method for evaporating on a to-be-evaporated object by vaporizing an evaporation material inside a vacuum chamber, comprising:

feeding a wire-shaped evaporation material to a vacuum chamber, providing an evaporation boat as an evaporation source having a boat main body with a containing part for the evaporation material, and electrode mounting plate parts respectively extending outward at both ends of the boat main body;

feeding the wire-shaped evaporation material from above a bottom plate of the boat main body defining the containing part of the evaporation material in a manner to come into contact with the bottom plate;

applying electric power across both the electrode mounting plate parts in order to heat the boat main body, thereby vaporizing the evaporation material inside the containing part, and continuously displacing the front end part of the wire-shaped evaporation material relative to the boat main body while the wire-shaped evaporation material is being fed to the vacuum chamber such that the movement restrains generation of a temperature gradient in the bottom plate of the boat main body, provided that two axis directions extending perpendicularly to each other in an in-plane of the bottom plate of the boat main body defining the containing part are defined as X-axis direction and Y-axis direction, respectively, and further provided that such a position of the bottom plate of the boat main body as initially comes into contact with the front end part of the wire-shaped evaporation material is defined as an origin, wherein, in the continuously displacing, the front end part of the evaporation material keeps on sequentially repeating, from the origin, a relative movement in the X-axis direction and a relative movement in the Y-axis direction, and finally returning to the origin.

* * * * *